United States Patent [19]
Endresen et al.

[11] Patent Number: 5,832,002
[45] Date of Patent: Nov. 3, 1998

[54] METHOD FOR CODING AND DECODING A DIGITAL MESSAGE

[75] Inventors: Jan Endresen, Billingstad; Erik Carlson, Nesoddhøgda, both of Norway

[73] Assignee: ABB Signal AB, Stockholm, Sweden

[21] Appl. No.: 814,938

[22] Filed: Mar. 10, 1997

Related U.S. Application Data

[63] Continuation of Ser. No. 204,381, May 8, 1995, abandoned.

[30] Foreign Application Priority Data

Sep. 20, 1991 [NO] Norway .................................. 913075

[51] Int. Cl.⁶ .............................. H03M 13/00; H04L 7/00
[52] U.S. Cl. ......................................................... 371/47.1
[58] Field of Search ...................................... 371/42, 47.1

[56] References Cited

U.S. PATENT DOCUMENTS

| | | | |
|---|---|---|---|
| 3,336,467 | 8/1967 | Frey, Jr. ........................................ | 371/42 |
| 3,550,082 | 12/1970 | Tong ........................................ | 371/42 |
| 3,571,794 | 3/1971 | Tong ........................................ | 371/42 |
| 3,863,215 | 1/1975 | McGrogan, Jr. ........................ | 371/69.1 |
| 4,059,825 | 11/1977 | Greene ........................................ | 371/42 |
| 4,404,677 | 9/1983 | Grande et al. .......................... | 371/69.1 |
| 4,468,770 | 8/1984 | Metcalfe et al. ......................... | 371/42 |
| 4,541,095 | 9/1985 | Vries ..................................... | 371/69.1 |
| 4,709,376 | 11/1987 | Kage ....................................... | 371/69.1 |
| 5,084,891 | 1/1992 | Ariyavisitakul et al. ................. | 371/42 |

OTHER PUBLICATIONS

Bahl, L., et al., "Shortened Cyclic Code with Burst Error Detection and Synchronization Recovery Capability", *IBM TDB*, vol. 16, No. 6, Nov. 1973, pp. 2026–2027.

Bahl, L., et al., "Shortened Cyclic Code with Burst Error Detection and Synchronization Recovery Capabiliyt", *IBM TDB*, vol. 16, No. 6, Nov. 1973, pp. 2088–2030.

*Primary Examiner*—Stephen M. Baker
*Attorney, Agent, or Firm*—Watson Cole Grindle Watson, P.L.L.C.

[57] ABSTRACT

The present invention relates to a method for coding and transmitting a digital message ($c(x)$) comprising a first number of information bits ($a(x)$) and a second number of control bits ($b(x)$), said message or code word being normally transmitted continuously, as well as a method for receiving and decoding such a digital message. In order to allow for a reliable block synchronization and error detection, there is according to the invention suggested a code format by which there is avoided the need to wait for a start of a block or message, and by which there is allowed verification before syncronization.

23 Claims, 3 Drawing Sheets

METHOD FOR CODING AND DECODING A DIGITAL MESSAGE

This is a continuation of application Ser. No. 08/204,381 filed Mar. 8, 1995, now abandoned.

FIELD OF THE INVENTION

The present invention relates to a method for coding and transmitting a digital message comprising a first number of information bits and a second number of control bits, the digital message being normally transmitted continuously and repeatedly.

Further, the invention relates to a method for receiving and decoding a transmitted digital message comprising a first number of information bits and a second number of control bits, said digital message or code word being normally received continuously and repeatedly.

BACKGROUND OF THE INVENTION

The present invention has been developed in connection with automatic train control systems, but should not be limited to such systems. Further, the present invention has been developed in connection with intermittent communication, in which the communication can last only for a certain period of time due to physical constraints, but neither shall the invention be limited to this specific type of communication.

However, in the present specification the invention will be explained in connection with, for example, an automatic train system.

PRIOR ART

In intermittent communication which due to physical constraints can only last for a certain period, it is important to maximize the information transferred for a given reliability. An example is a train passing a radio beacon which transmits a message containing control information. The normal way to solve this problem is for the beacon to transmit a known synchronization bit pattern before the message. This may put a constraint on the information in the message to avoid false synchronization. To ensure that the train receives at least one complete message, it is necessary to allow time for almost two messages to be received since the receiver could just miss the first bit of a message and therefore have to wait for the next message.

Another way of solving the synchronization problem is to slave the radio beacon to the train receiver, but this is more complex and requires a transmitter in the train. The message is repeatedly transmitted by the beacon to increase the probability of correct reception. Those aspects of the system that are relevant can be summarized as follows.

- The beacon transmits a binary message of the given length n. This message is repeated without gaps for as long as the beacon gets enough power.
- The receiver must be able to determine the block boundaries in the received data stream.
- The probability of undetected error (the reliability) of the transmission must be guaranteed.

OBJECTS OF THE PRESENT INVENTION

An object of the present invention is to provide a method in which there is avoided the need to wait for a start of a block or message, and in which there is allowed data verification before synchronization.

Another object of the present invention is to provide a method in which the received telegram can be as short as the length of the message or code word.

Yet another object of the present invention is to provide a method in which the receiving time can be reduced to a minimum.

Still another object of the present invention is to provide a method in which the probability of receiving a correct message and the correct synchronization thereof is guaranteed.

Further, an object of the present invention is to use error control codes in a new way giving a new code format in which error control and synchronization are combined in the same parity bits.

DISCLOSURE OF THE INVENTION

In connection with a method as stated in the introductory part, the above objects are achieved in that on the transmitter side there is selected a generator polynomial producing a cyclic code, that said information bits are divided by said generator polynomial for thereby generating a remainder polynomial which is included in the message to be transmitted as said second number of control bits.

Thereby is achieved a valid code word provided the correct number of bits are received, but independent of the synchronization shift or start bit thereof.

In order to facilitate the control of any synchronization shift in the message or code word it is required that on the transmitter side there are selected first and second polynomials both being generators for cyclic codes, which polynomials are multiplied with each other, and that said information bits are divided by the product for thereby generating a remainder polynomial which is included in the message to be transmitted as said second number of control bits, and more specifically in that the first of the two cyclic code generator polynomials is used for controlling error detecting capability of the message in question, whereas the second of the two cyclic code generator polynomials is used for acquiring synchronization.

In a specific embodiment the length of the digital message or code word comprises a specific number of n bits, and there is used first and second selected generator polynomials which both produce cyclic code words of length n, said second generator polynomial being irreducible and not a factor in said first generator polynomial.

In a still more specific embodiment an offset polynomial is added modulo 2 to the remainder of the code word in question, the offset polynomial being divisible by the error control generator polynomial but not the synchronization generator polynomials.

Consequently, at the receiver side the method according to the present invention is characterized in that the message or code word is registered as such independently of the sequential appearance of the start of the information bits as long as the correct number of bits (n) in one message block are received.

Further features and advantages relating to the present invention will appear from the following detailed description, reference being made to the appending drawings.

BRIEF DISCLOSURE OF THE DRAWINGS

DETAILED DESCRIPTION OF EMBODIMENTS

The present invention will now be explaned in general terms, it being understood that the invention suggests using error control codes in a new way, for thereby generating a new code format in which error control and synchronization are combined in the same parity bits.

The code format

Binary vectors will be denoted by polynomials, e.g. the vector $v=[v_{k-1},\ldots,v_1,v_o]$, is represented by the polynomial $$v(x)=v_{k-1}x^{k-1}\ldots+v_1x+v_o.$$

For references on coding theory see ref.1, 2 and 3.

The transmitted message (the code word) will be denoted by $c=[c_{n-1}\ldots c_1,c_o]$, corresponding to the polynomial $c(x)$. The order of transmission is from left to right, i.e. $c_{n-1}$ is the bit transmitted first, then $c_{n-2}$, etc, and $c_o$ is transmitted last. The same message is repeated continually.

The transmitted messages are code words in a cyclic code of length n, the generator polynomial of which will be called $g(x)$; i.e. $c(x)$ is divisible by $g(x)$. A cyclic code is such that every valid code word can be divided into two parts and the parts interchanged, and the new code word will still be valid. The error detecting and error correcting capability of the proposed scheme comes from $g(x)$. The degree of $g(x)$ will be denoted by m.

A second polynomial, which will be denoted by $f(x)$, will be used for synchronization. The polynomial $f(x)$ is irreducible divides $x_n-1$ but does not divide $x^m-1$ for $0<m<n$, is not a factor of $g(x)$.

These constraints are easily satisfied and still leave some freedom in the choice of $f(x)$. The degree of $f(x)$ will be denoted by l. The above constraints ensure that any cyclic shift of the code word has a unique syndrome with respect to $f(x)$.

For any two polynomials $h(x)$ and $p(x)$ non zero, let $R_{p(x)}[h(x)]$ denote the unique polynomial $r(x)$ of degree less than $\deg[p(x)]$ that satisfies $$h(x)=q(x)p(x)+r(x),$$

i.e, it is the remainder that results from dividing $h(x)$ by $p(x)$.

Let $a(x)$ be the information polynomial, i.e, the polynomial corresponding to the binary vector $[a_{k-1},\ldots a_1,a_O]$ of information bits. The number k of information bits equals n-l-m. Note that there is no constraint on the information bits, i.e, all $2^k$ possibilities are allowed.

The encoding rule is:

$$c(x)=x^{m+l}a(x)+R_{f(x)g(x)}[x^{m+l}a(x)]+o(x).$$

The multiplication of $a(x)$ with the factor $x^{m+l}$ has the effect of shifting the information m+l to the left, leaving m+l bits free for the parity and offset bits.

Figure 1:
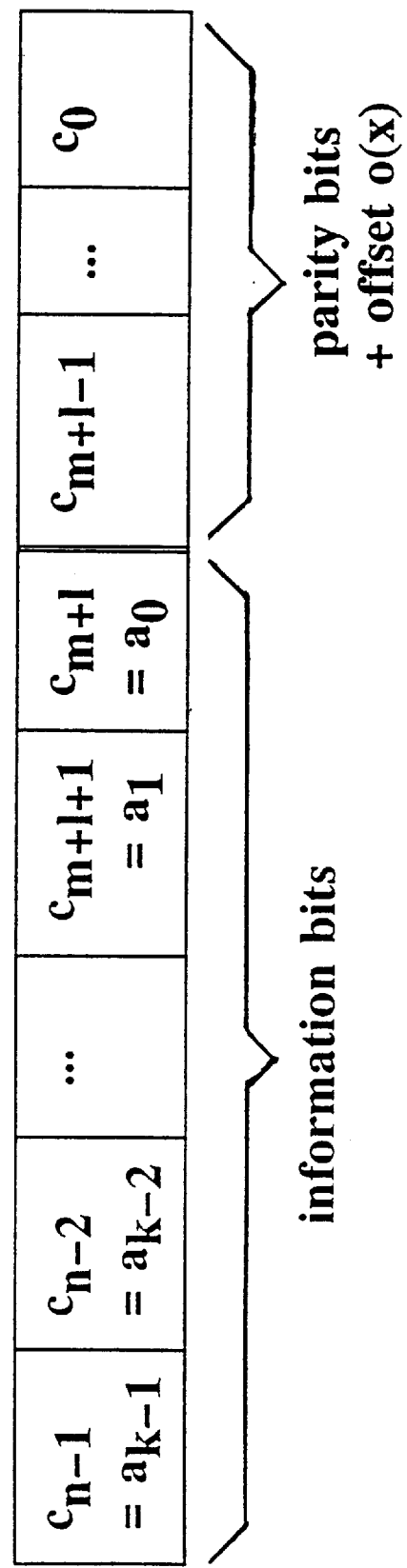
FIG. 1 illustrates the format of a code word block.

The remainder is calculated with respect to the product of $f(x)$ and $g(x)$. The binary polynomial $o(x)$ ("offset") is used for synchronization. It is divisible by $g(x)$ but not $f(x)$, and its degree is smaller than m+l. Any binary polynomial satisfying these constraints can be used; and as for $f(x)$ above, there is no reason to choose a particular $o(x)$. The resulting code format is shown in FIG. 1.

The bits are transmitted from left to right, i.e, in the order $c_{n-1},c_{n-2}\ldots,c_1, c_O, c_{n-1}, c_{n-2}\ldots$.

Since $o(x)$ is divisible by $g(x)$, $c(x)$ is always divisible by $g(x)$ and is therefore a code word in the cyclic code generated by $g(x)$. Note also that $c(x)-o(x)$ is divisible by $f(x)$, but $c(x)$ is not.

The central idea of this code format is that in the absence of errors, any block of length n that is cut out of the transmitted data stream is a code word in the cyclic code generated by $g(x)$. Any such block is thus protected by the full error-detecting capability provided by $g(x)$. The code format of this section may be used with a varity of codes.

Decoding

The basic operation to be performed by the receiver is thus as follows:

1. Receive a block of n bits.
2. Look at a given window of length n. Verify this code word with respect to $g(x)$. If this is possible, go to step 3; otherwise shift the window and do step 2 again.
3. Recover data from window based on parity check with respect to $f(x)$.

As an alternative, the shifting of the windows in the case of an unsuccessful decoding attempt can be left out. Permitting this shifting of the window increases the probability of successful transmission but also the probability of undetected error.

Figure 2:
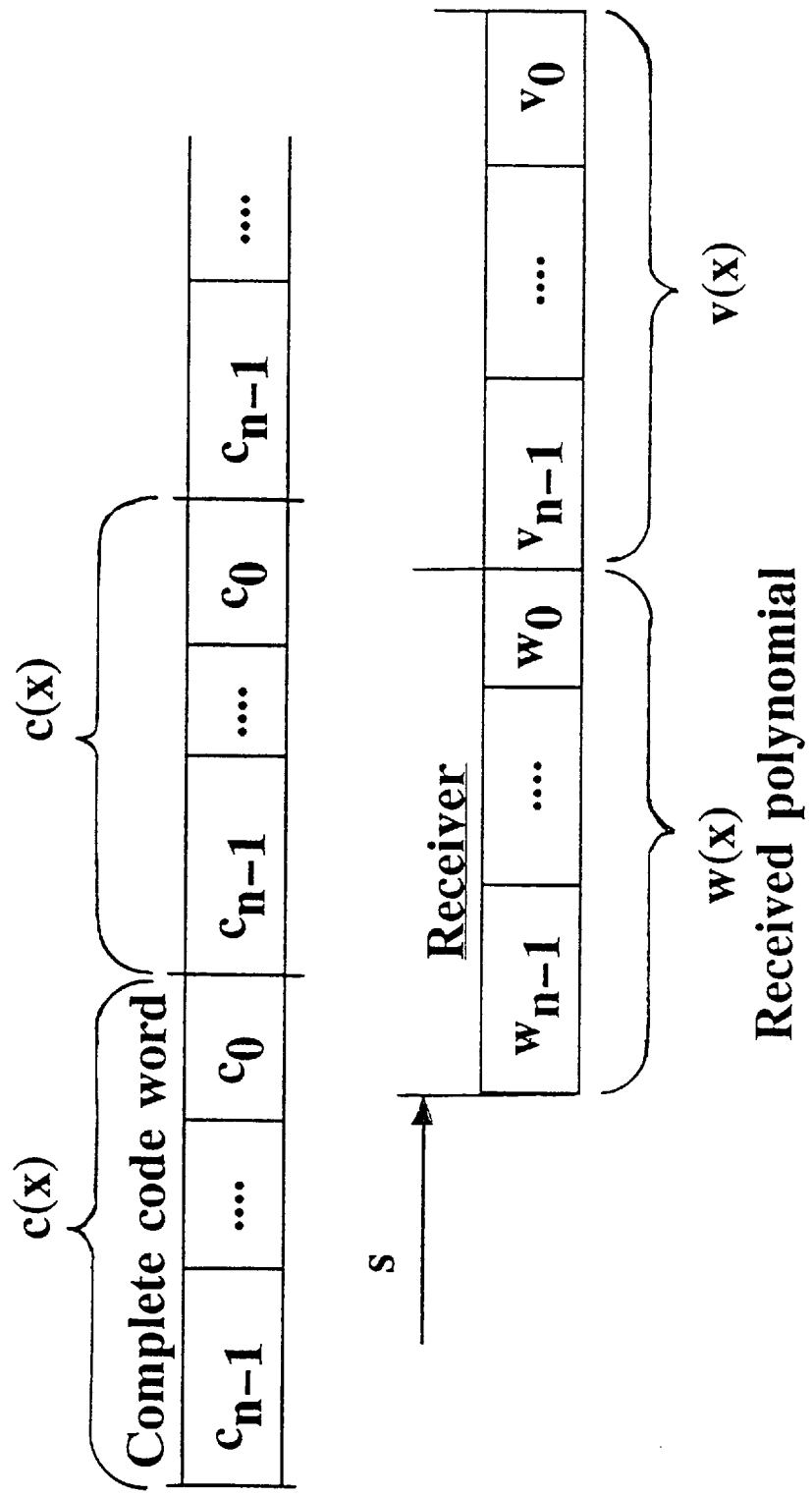
FIG. 2 illustrates the polynomial corresponding to the data seen through a window of length n.

Now, consider point 3 of this procedure, i.e. the recovery of the information from the window. Let $w(x)$ be the polynomial that corresponds to the data block as seen through a window of length n that is shifted by s positions with respect to the block boundaries of the transmitted data, see FIG. 2.

If s is the shift between the block boundaries of the data stream and the window, then $$w(x)=R_{x^n-1}[x^s\cdot c(x)],$$

provided that no errors have occurred.

In the absence of errors, $w(x)=R_xn_{-1}[x^sc(x)]$. The result of the computation $$\begin{aligned}R_{f(x)}[w(x)] &= R_{f(x)}[R_x^n-1[x^sc(x)]]\\ &= R_{f(x)}[x^sc(x)]\\ &= R_{f(x)}[x^sR_{f(x)}[c(x)]]\\ &= R_{f(x)}[x^so(x)]\end{aligned}$$

shows that all shifts s in the range 0 ... n−1 have unique syndrome $R_{f(x)}[w(x)]$. For, let s and s', $s \leq s'$ be two shifts in that range, and consider $$R_{f(x)}[x^so(x)]-R_{f(x)}[x^{s'}o(x)]=R_{f(x)}[x^s(1-x^{s'-s})o(x)].$$

Figure 3:
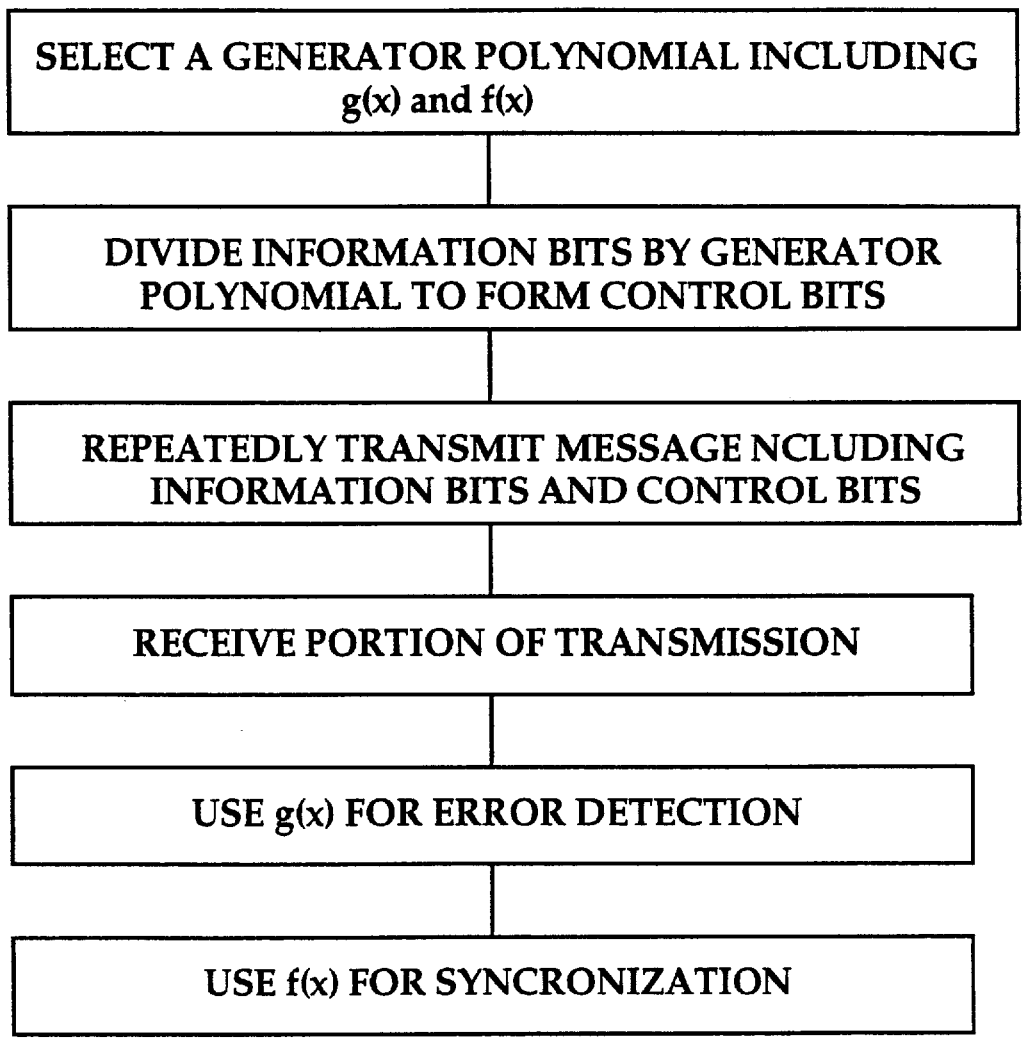
FIG. 3 is a flowchart showing steps of encoding, transmitting, receiving and decoding in accordance with the inventive method.

Since both xs and $o(x)$ have no common factors with $f(x)$, this expression is zero if and only if $f(x)$ divides $1-x^{s'-s}$; but since n is the smallest integer such that $f(x)$ divides $x^n-1$, this implies s'=s. The information $a(x)$ can thus easily be recovered from $w(x)$: i.e. shifting $w(x)$ cyclically s times to the right yields $c(x)$. FIG. 3 illustrates steps of encoding, transmitting, receiving and decoding.

References

1. W. W. Peterson and E. J. Weldon, Jr. Error-Correcting Codes, 2nd edition, Cambridge: MIT Press, 1972.
2. R. E. Blahut, Theory and Practice of Error Control Codes, Addison-Wesley, 1983.
3. Shu Lin and D. J. Costello, Error Control Coding, Fundamentals and Applications, Prentice Hall, 1983.

We claim:

1. A method for coding and transmitting a digital message (c(x)) of n bits comprising a first number (a(x)) of information bits and a second number (b(x)) of control bits which together form the digital message (c(x)) comprising the steps of:

selecting a generator polynomial (CRC(x)) including first and second polynomials (g(x)) and (f(x)), respectively, each capable of producing a corresponding cyclic code of n bits;

multiplying said first and second polynomials with each other resulting in a product (g(x))*(f(x));

dividing the information bits (a(x)) by the product resulting in a remainder polynomial ($C_r(X)$);

including the remainder polynomial by said second number of control bits in the digital message to be transmitted;

transmitting said digital message repeatedly continuously at least once;

using (g(x)) first for error detection where (g(x)) has a degree m, and (c(x)) is divisible by (g(x)) such that every valid message is divisible into parts, each of which parts are interchangeable with each other and remain valid; and then using (f(x)) for synchronization where (f(x)) is irreducible; divides $x^{n-1}$ but does not divide $x^{m-1}$ for o<m<n; and is not a factor of (g(x)).

2. The method as set forth in claim 1 further comprising adding an offset polynomial (o(x)) modulo 2 to the remainder polynomial, said offset polynomial (o(x)) being divisible by the first polynomial (g(x)) and not by the second polynomial (f(x)).

3. The method according to claim 1 further comprising the steps of receiving said digital message repeatedly continuously at least once, and registering the received digital message independent of where the digital message starts as long as n sequential bits of the receiving digital message are received in one message block.

4. The method as set forth in claim 3 further comprising the steps of dividing the received digital message (c(x)) by the second polynomial (f(x)) and producing a local remainder corresponding to a number of bits that the received digital message has to be rotated to recover the information bits (a(x)).

5. The method of claim 4 wherein the number of bits the digital message has to be rotated is uniquely determined by a non-zero first local remainder.

6. The method as set forth in claim 4 further comprising the step of dividing the received digital message by the first polynomial (g(x)) and producing the local remainder indicative of a probable error free digital message.

7. The method of claim 6 wherein the received digital message is probably error free when the local remainder is zero.

8. The method as set forth in claim 6 comprising the steps of rotating and dividing the received digital message by the second polynomial (f(x)) until the local remainder is equal to the remainder polynomial ($c_r(x)$).

9. The method of claim 8 further comprising the step of recovering the information polynomial (a(x)) from the rotated received digital message.

10. A method for coding and transmitting a digital message (c(x)) of n bits comprising a first number (a(x)) of information bits and a second number (b(x)) of control bits which together form the digital message (c(x)) comprising the steps of:

selecting a generator polynomial (CRC(x)) including first and second polynomials (g(x)) and (f(x)), respectively, each capable of producing a corresponding cyclic code of n bits;

multiplying said first and second polynomials with each other resulting in a product (g(x))≠(f(x));

dividing the information bits (a(x)) by the product resulting in a remainder polynomial ($c_r(x)$);

including the remainder polynomial by said second number of control bits in the digital message to be transmitted;

transmitting said digital message repeatedly so that n bits of the digital message (c(x)) are transmitted continuously as a message block at least once;

utilizing a portion of the transmitted message for error detection; and utilizing a portion of the transmitted message for synchronization after error detection.

11. The method as set forth in claim 10 wherein the portion of the message utilized for error detection includes the first polynomial (g(x)).

12. The method as set forth in claim 11 where (g(x)) has a degree m, and (c(x)) is divisible by (g(x)) such that every valid message is divisible into parts, each of which parts are interchangeable with each other and remain valid.

13. The method as set forth in claim 11 wherein the portion of the message utilized for synchronization includes the second polynomial (f(x)).

14. The method as set forth in claim 13 wherein (f(x)) is irreducible; divides $x^{n-1}$ but does not divide $x^{m-1}$ for o<m<n; and is not a factor of (g(x)).

15. The method as set forth in claim 10 further comprising adding an offset polynomial (o(x)) modulo 2 to the remainder polynomial, said offset polynomial (o(x)) being divisible by the first polynomial (g(x)) and not by the second polynomial (f(x)).

16. The method according to claim 10 further comprising the step of:

receiving said digital message repeatedly so that n bits of the digital message (c(x)) are received continuously as a block at least once; and registering the received digital message independent of where the digital message starts as long as n sequential bits of the receiving digital message are received in one message block.

17. The method as set forth in claim 10 further comprising the steps of:

dividing the received digital message (c(x)) by the second polynomial (f(x)) and producing a local remainder corresponding to a number of bits that the received digital message has to be rotated to recover the information bits (a(x)).

18. The method of claim 17 wherein the number of bits the digital message has to be rotated is uniquely determined by a non-zero first local remainder.

19. The method as set forth in claim 17 further comprising the step of dividing the received digital message by the first polynomial (g(x)) and producing the local remainder indicative of a probable error free digital message.

20. The method of claim 19 wherein the received digital message is probably error free when the local remainder is zero.

21. The method as set forth in claim 19 comprising the steps of rotating and dividing the received digital message by the second polynomial (f(x)) until the local remainder is equal to the remainder polynomial ($c_r(x)$).

22. The method of claim 21 further comprising the step of recovering the information polynomial (a(x)) from the rotated received digital message.

23. The method of claim 10 wherein the step of utilizing a portion of the transmitted message for synchronization comprises utilizing a minimum portion of said transmitted message for said synchronization.

* * * * *